United States Patent
Perkins et al.

(10) Patent No.: US 10,797,090 B2
(45) Date of Patent: Oct. 6, 2020

(54) IMAGE SENSOR WITH NEAR-INFRARED AND VISIBLE LIGHT PHASE DETECTION PIXELS

(71) Applicant: SEMICONDUCTOR COMPONENTS INDUSTRIES, LLC, Phoenix, AZ (US)

(72) Inventors: Andrew Eugene Perkins, Boise, ID (US); Swarnal Borthakur, Boise, ID (US); Marc Allen Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/460,791

(22) Filed: Jul. 2, 2019

(65) Prior Publication Data
US 2020/0273892 A1 Aug. 27, 2020

Related U.S. Application Data

(60) Provisional application No. 62/811,376, filed on Feb. 27, 2019.

(51) Int. Cl.
*H01L 27/146* (2006.01)

(52) U.S. Cl.
CPC .... *H01L 27/14601* (2013.01); *H01L 27/1463* (2013.01); *H01L 27/1464* (2013.01); *H01L 27/14629* (2013.01); *H01L 27/14649* (2013.01); *H01L 27/1462* (2013.01); *H01L 27/14627* (2013.01)

(58) Field of Classification Search
None
See application file for complete search history.

(56) References Cited

U.S. PATENT DOCUMENTS 7,375,803 B1  5/2008  Bamji
8,134,637 B2  3/2012  Rossbach et al.
(Continued)

OTHER PUBLICATIONS

EWBM Co, Ltd. "Revolutionary SoC for 3D Depth Extraction with a Single Camera: eWBM's DR1152." eWBM Co, Ltd. Press Release. Apr. 24, 2017. www.e-wbm.com/press_release_view.do?application_idx=23. Accessed Feb. 15, 2019.

*Primary Examiner* — Cheung Lee
(74) *Attorney, Agent, or Firm* — Treyz Law Group, P.C.; Joseph F. Guihan

(57) ABSTRACT

An imaging system may include an image sensor with phase detection pixel groups for depth sensing or automatic focusing operations. Each phase detection pixel group may have two or more photosensitive regions covered by a single microlens so that each photosensitive region has an asymmetric angular response. The image sensor may be sensitive to both near-infrared (NIR) and visible light. Each phase detection pixel group may be designed to include light-scattering structures that increase NIR sensitivity while minimizing disruptions of phase detection and visible light performance. Deep trench isolation may be formed between adjacent photosensitive areas within the phase detection pixel group. The light-scattering structures may have a non-uniform distribution to minimize disruptions of phase detection performance.

20 Claims, 20 Drawing Sheets

(56) References Cited

U.S. PATENT DOCUMENTS

| | | |
|---|---|---|
| 2013/0321589 A1 | 12/2013 | Kirk et al. |
| 2015/0340391 A1 | 11/2015 | Webster |
| 2017/0025467 A1 | 1/2017 | Haddad et al. |
| 2017/0094261 A1 | 3/2017 | Teslenko |
| 2017/0133420 A1* | 5/2017 | Silsby ............... H01L 27/14634 |
| 2017/0323455 A1 | 11/2017 | Bittan et al. |
| 2018/0006072 A1* | 1/2018 | Roy .................. H01L 27/14627 |
| 2018/0102389 A1* | 4/2018 | Lee ................... H01L 27/14645 |
| 2019/0067354 A1* | 2/2019 | Cheng ............... H01L 27/14645 |

\* cited by examiner

IMAGE SENSOR WITH NEAR-INFRARED AND VISIBLE LIGHT PHASE DETECTION PIXELS

CROSS-REFERENCE TO RELATED APPLICATIONS

This application claims the benefit of U.S. Provisional Patent Application No. 62/811,376, filed on Feb. 27, 2019, the entire contents of which is incorporated herein by reference.

BACKGROUND

This application relates to image sensors, and more particularly, image sensors that have visible and near-infrared light sensitivity.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light. Circuitry is commonly coupled to each pixel column for reading out image signals from the image pixels. A color filter element typically covers each photodiode.

Several image sensor applications (such as security cameras) require visible light and near-infrared (NIR) image sensor sensitivity at the same time. Conventional systems use a physically moveable IR filter to obtain near-infrared and visible light sensitivity. However, this is impractical and there is a strong need for a low-cost image sensor with both visible light and near-infrared (NIR) sensitivity.

Additionally, some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

It would therefore be desirable to provide image sensors with visible and near-infrared light sensitivity as well as depth sensing capabilities.

DETAILED DESCRIPTION

Figure 1:
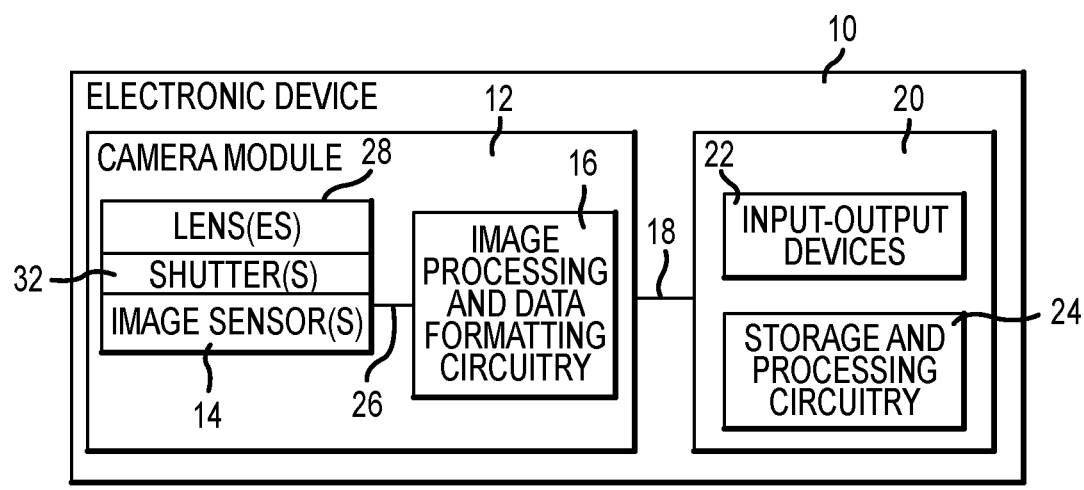
FIG. 1 is a schematic diagram of an illustrative electronic device with an image sensor that may include phase detection pixels in accordance with an embodiment.

Embodiments of the present invention relate to image sensors with automatic focusing and depth sensing capabilities. An electronic device with a camera module is shown in FIG. 1. Electronic device 10 may be a digital camera, a computer, a cellular telephone, a medical device, or other electronic device. Camera module 12 (sometimes referred to as an imaging device or imaging system) may include one or more image sensors 14, one or more shutters 32, and one or more lenses 28. During operation, lenses 28 (sometimes referred to as optics 28) focus light onto image sensor 14. Light from lenses 28 may pass through an aperture (opening) in shutter 32 to reach image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus. Image processing and data formatting circuitry may be used to store calibration information that is used to help perform the depth sensing. Control circuitry (e.g., control circuitry in image processing and data formatting circuitry 16) may also be included in the imaging system to control lens(es) 28 and shutter(s) 32.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel group 100 (sometimes referred to as pixel pair 100) shown in FIG. 2A.

Figure 2A:
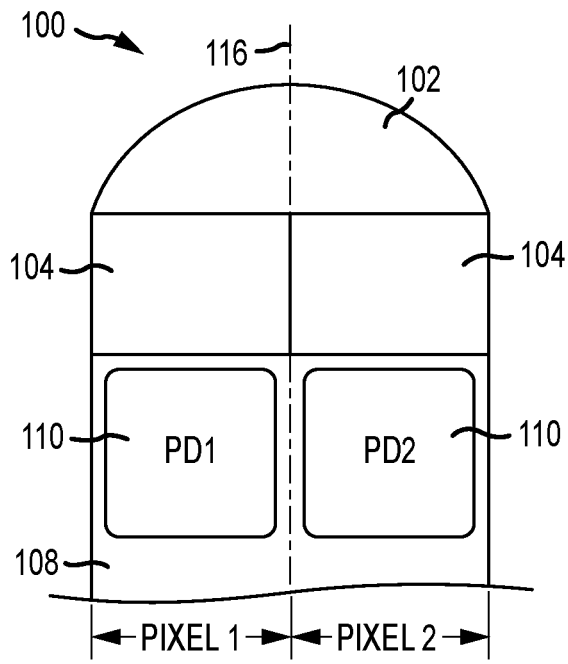
FIG. 2A is a cross-sectional view of illustrative phase detection pixels having photosensitive regions with different and asymmetric angular responses in accordance with an embodiment.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Microlens 102 may have a width and a length, with the length being longer than the width. Microlens 102 may have a length that is about (e.g., within 5% of) twice as long as its width. Microlens 102 may be in the shape of an ellipse with an aspect ratio of about (e.g., within 5% of) 2:1. In other embodiments, microlens 102 may be another shape such as a rectangle or another desired shape. Microlens 102 may have an aspect ratio of 1:1, less than 2:1, 2:1, greater than 2:1, greater than 3:1, or any other desired aspect ratio.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

The arrangement of FIG. 2A in which microlens 102 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement. In other embodiments, phase detection pixels may be grouped in a 2×2 (with four pixels covered by a single microlens), 3×3 (with nine pixels covered by a single microlens), or 2×4 (with eight pixels covered by a single microlens) arrangement. In general, phase detection pixels may be arranged in any desired manner.

An image sensor can be formed using front side illumination imager arrangements (e.g., when circuitry such as metal interconnect circuitry is interposed between the microlens and photosensitive regions) or backside illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
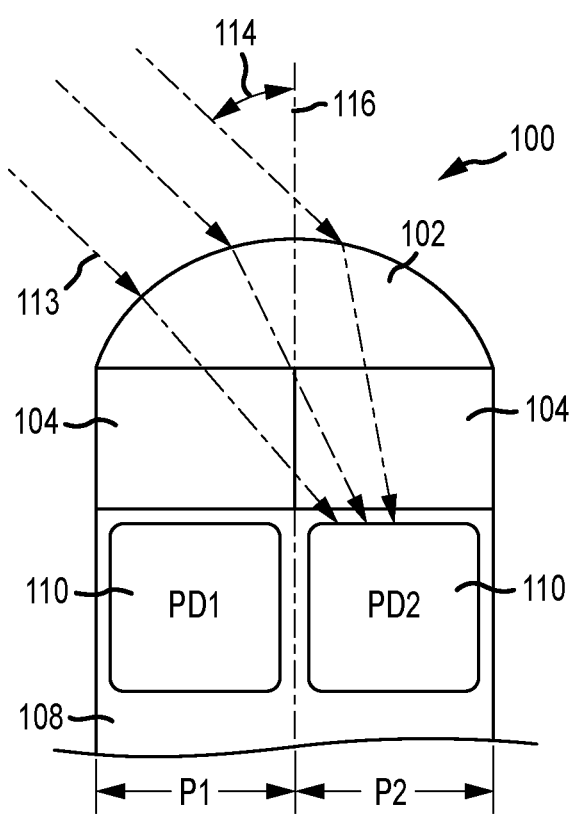
FIGS. 2B and 2C are cross-sectional views of the phase detection pixels of FIG. 2A in accordance with an embodiment.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
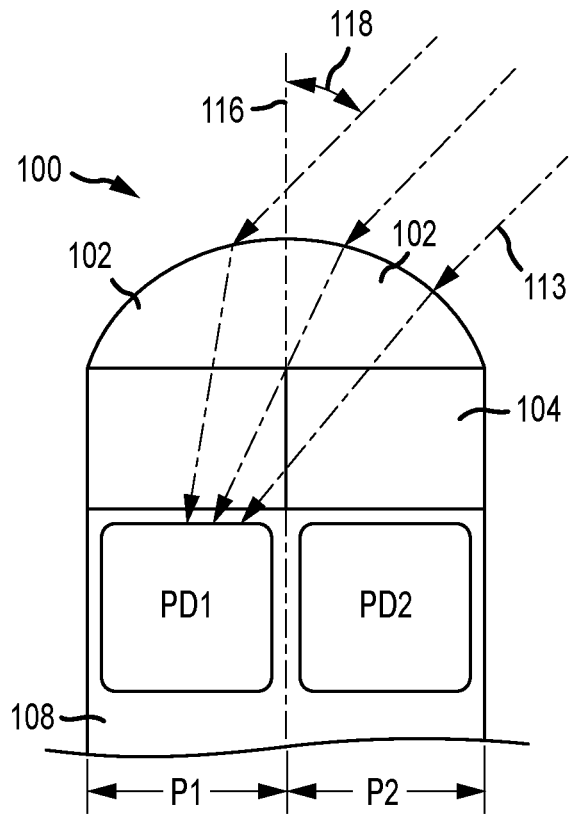

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
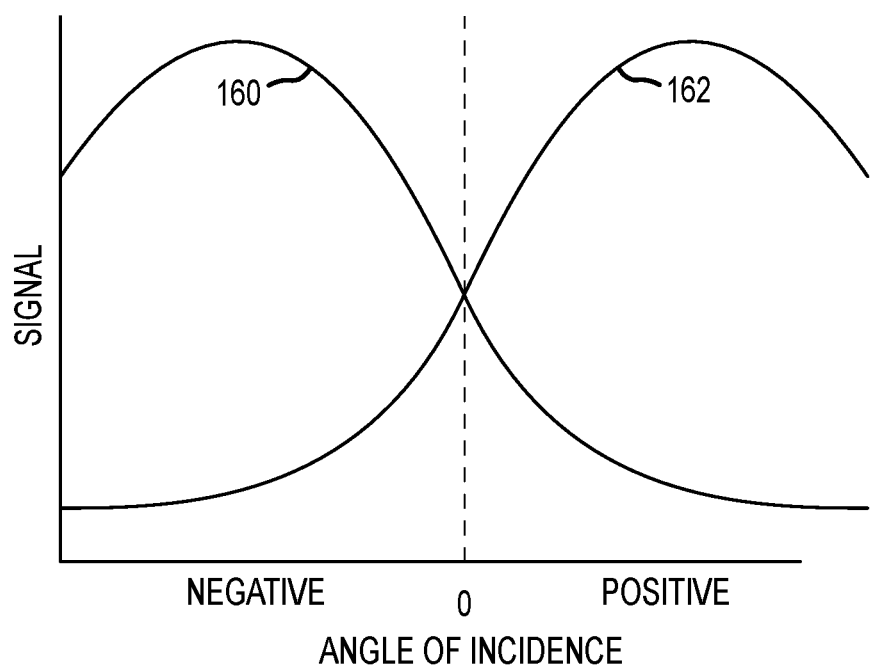
FIG. 3 is a diagram of illustrative signal outputs of phase detection pixels for incident light striking the phase detection pixels at varying angles of incidence in accordance with an embodiment.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Figure 4A:
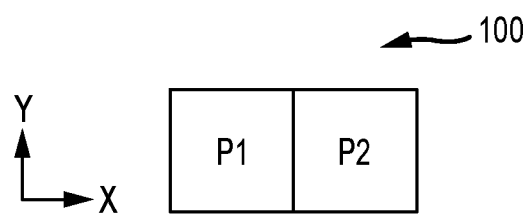
FIG. 4A is a top view of an illustrative phase detection pixel pair arranged horizontally in accordance with an embodiment.
Figure 4B:
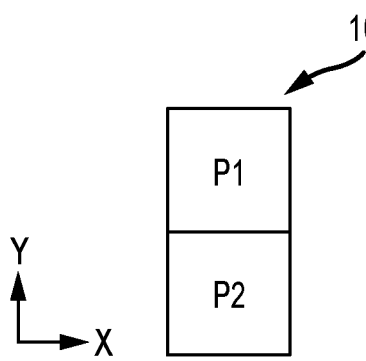
FIG. 4B is a top view of an illustrative phase detection pixel pair arranged vertically in accordance with an embodiment.
Figure 4C:
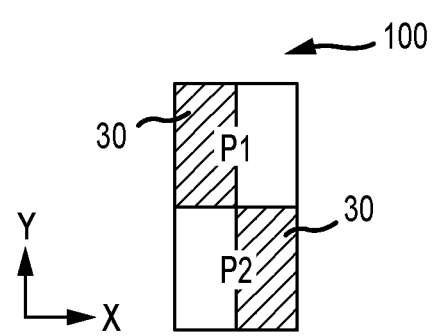
FIG. 4C is a top view of an illustrative phase detection pixel pair arranged vertically and configured to detect phase differences along the horizontal direction (e.g., across vertical edges) in accordance with an embodiment.

Pixel pairs 100 may be arranged in various ways. For example, as shown in FIG. 4A, Pixel 1 (referred to herein as P1) and Pixel 2 (referred to herein as P2) of pixel pair 100 may be oriented horizontally, parallel to the x-axis of FIG. 4A (e.g., may be located in the same row of a pixel array). In the example of FIG. 4B, P1 and P2 are oriented vertically, parallel to the y-axis of FIG. 4B (e.g., in the same column of a pixel array). In the example of FIG. 4C, P1 and P2 are arranged vertically and are configured to detect phase differences in the horizontal direction, such as from vertical edges (e.g., using an opaque light shielding layer such as metal mask 30).

Figure 5:
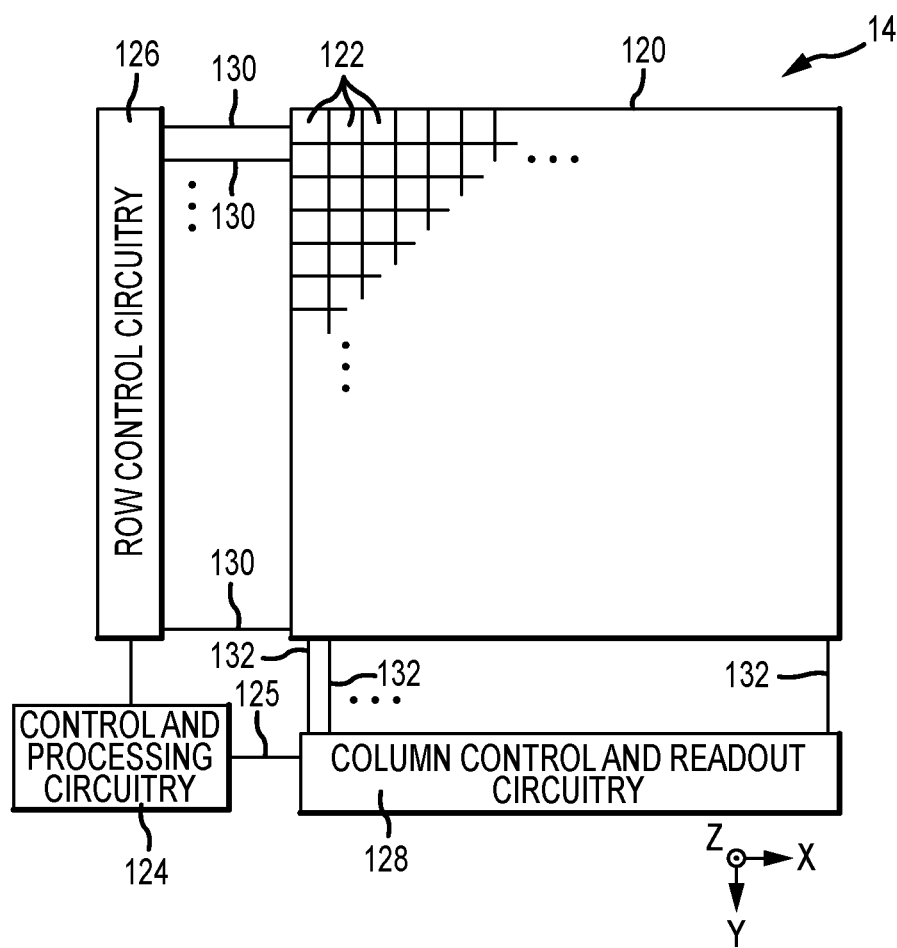
FIG. 5 is a diagram of an illustrative pixel array and associated readout circuitry for reading out image signals in an image sensor in accordance with an embodiment.

As shown in FIG. 5, image sensor 14 may include a pixel array 120 containing image sensor pixels 122 arranged in rows and columns (sometimes referred to herein as image pixels, phase detection pixels, or pixels) and control and processing circuitry 124. Array 120 may contain, for example, hundreds or thousands of rows and columns of pixels 122. Control circuitry 124 may be coupled to row control circuitry 126 and image readout circuitry 128 (sometimes referred to as column control circuitry, readout circuitry, processing circuitry, or column decoder circuitry). Row control circuitry 126 may receive row addresses from control circuitry 124 and supply corresponding row control signals such as reset, row-select, charge transfer, dual conversion gain, and readout control signals to pixels 122 over row control paths 130. One or more conductive lines such as column lines 132 may be coupled to each column of pixels 122 in array 120. Column lines 132 may be used for reading out image signals from pixels 122 and for supplying bias signals (e.g., bias currents or bias voltages) to pixels 122. If desired, during pixel readout operations, a pixel row in array 120 may be selected using row control circuitry 126 and image signals generated by image pixels 122 in that pixel row can be read out along column lines 132.

Image readout circuitry 128 may receive image signals (e.g., analog pixel values generated by pixels 122) over column lines 132. Image readout circuitry 128 may include sample-and-hold circuitry for sampling and temporarily storing image signals read out from array 120, amplifier circuitry, analog-to-digital conversion (ADC) circuitry, bias circuitry, column memory, latch circuitry for selectively enabling or disabling the column circuitry, or other circuitry that is coupled to one or more columns of pixels in array 120 for operating pixels 122 and for reading out image signals from pixels 122. ADC circuitry in readout circuitry 128 may convert analog pixel values received from array 120 into corresponding digital pixel values (sometimes referred to as digital image data or digital pixel data). Image readout circuitry 128 may supply digital pixel data to control and processing circuitry 124 and/or image processing and data formatting circuitry 16 (FIG. 1) over path 125 for pixels in one or more pixel columns.

If desired, image pixels 122 may include one or more photosensitive regions for generating charge in response to image light. Photosensitive regions within image pixels 122 may be arranged in rows and columns on array 120. Pixel array 120 may be provided with a color filter array having multiple color filter elements which allows a single image sensor to sample light of different colors. As an example, image sensor pixels such as the image pixels in array 120 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two color filters, with two green color filters diagonally opposite one another and adjacent to a red color filter diagonally opposite to a blue color filter. In another suitable example, the green color filters in a Bayer pattern are replaced by broadband color filter elements (e.g., a yellow, magenta, or clear color filter element). In yet another embodiment, one of the green color filters in a Bayer pattern may be replaced by an infrared color filter element. These examples are merely illustrative and, in general, color filter elements of any desired color and in any desired pattern may be formed over any desired number of pixels 122.

If desired, array 120 may be part of a stacked-die arrangement in which pixels 122 of array 120 are split between two or more stacked substrates. In such an arrangement, each of the pixels 122 in the array 120 may be split between the two dies at any desired node within pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any known metal-to-metal bonding technique, such as soldering or welding.

As mentioned above, the desired node in the pixel circuit that is split across the two dies may be a floating diffusion node. Alternatively, the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit.

Figure 6:
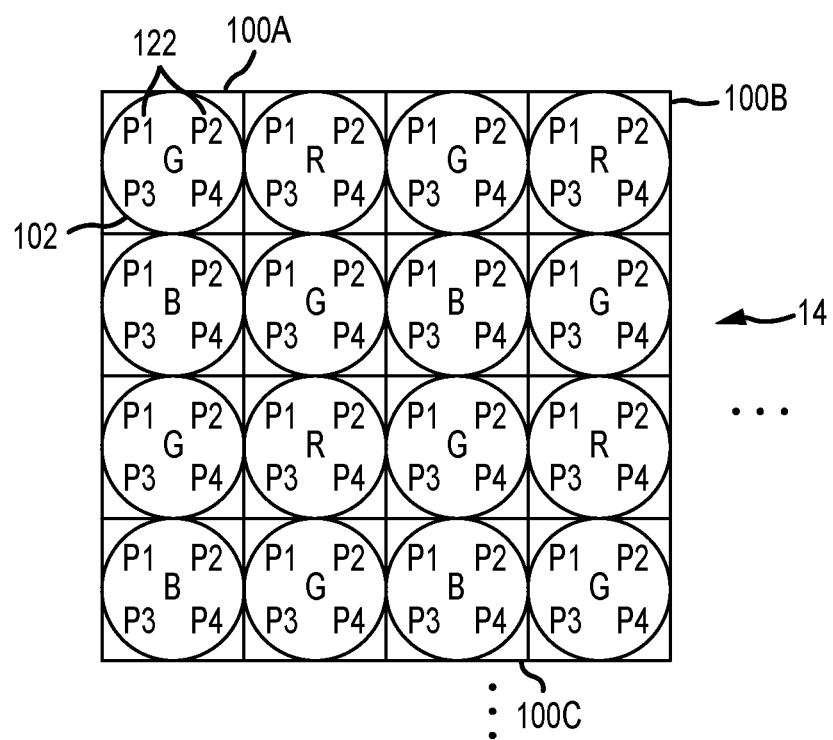
FIG. 6 is a top view of an illustrative image sensor with phase detection pixel groups that have four photosensitive areas in a 2×2 arrangement covered by a single microlens in accordance with an embodiment.

FIG. 6 is an illustrative diagram showing an image sensor 14 that may include phase detection pixel groups with multiple pixels covered by a single microlens 102. As shown, each pixel group 100 includes a number of pixels 122. In this illustrative example, each pixel group has four pixels (P1, P2, P3, and P4). Each pixel may have a respective photosensitive area. Each pixel in a respective group 100 may be covered by a color filter element of the same color. For example, pixels P1, P2, P3, and P4 in pixel group 100A may be covered by a green color filter element. Pixels P1, P2, P3, and P4 in pixel group 100B may be covered by a red color filter element. Pixels P1, P2, P3, and P4 in pixel group 100C may be covered by a blue color filter element. This example is merely illustrative. Each pixel may have a respective color filter element, multiple color filter elements may each cover multiple pixels in each pixel group 100, or a single color filter element may cover all four pixels in each pixel group 100.

Pixel group 100A may be a green pixel group formed adjacent to a blue pixel group, adjacent to a red pixel group, and diagonally opposite a second green pixel group to form a unit cell of repeating pixel groups 100. In this way, a Bayer mosaic pattern of pixel groups 100 may be created where each pixel group 100 includes four sub-pixels 122 arranged in two corresponding adjacent rows and two corresponding adjacent columns.

Forming each pixel group 100 with a single microlens 102 that covers a number of pixels 122 of the same color enables image sensor 14 to have phase detection capabilities. As discussed in connection with FIGS. 2A-2C and FIG. 3, covering multiple photodiodes with a single microlens may provide the photodiodes with an asymmetric angular response to incident light. The data acquired from the pixels may then be used to obtain phase detection data. In some examples, the data acquired from two pixels in the phase detection pixel group may be compared to obtain phase detection data.

Any pair of pixels may be used to obtain phase detection data. Pixels may be used that are in the same row (e.g., P1 and P2 or P3 and P4), in the same column (e.g., P1 and P3 or P2 and P4), or diagonally opposite each other (e.g., P1 and P4 or P2 and P3). The variety of available sub-pixel combinations enables image sensor 14 to detect a variety of types of edges. Horizontally oriented phase detection pixel pairs (e.g., P1 and P2) may be better suited to detect vertical edges in a scene, whereas vertically oriented phase detection pixel pairs (e.g., P1 and P3) may be better suited to detect horizontal edges in a scene. Similarly, the sub-pixels that are diagonally opposite each other (e.g., P1 and P4 or P2 and P3) may be suited to detect diagonal edges in the scene. In certain embodiments, image sensor 14 may use image processing circuitry 16 to use the data from P1, P2, P3, and P4 to search for edges in all orientations. Additionally, because different colored pixels (e.g., red, blue, green, etc.) all have phase detection capabilities, image sensor 14 may be able to detect edges in multiple colors. This will further improve the phase detection capabilities of image sensor 14.

The arrangement of FIG. 6 results in phase detection data being obtained across the entire pixel array of the image sensor. This results in a greater quantity of phase detection data available which may result in improved phase detection. In particular, the high density of phase detection pixels may improve resolution of fine details throughout the scene.

In certain applications, the phase detection data from across the entire pixel array may be used to create a depth map of the entire captured scene.

The arrangement of FIG. 6 may be effective for obtaining both visible light data and phase detection data. However, it may be desirable for image sensor 14 to also obtain near-infrared (NIR) light data. There are numerous ways to provide image sensor 14 with near-infrared light sensitivity. In one example, scattering structures may be provided in a given imaging pixel to enhance near-infrared light sensitivity. The scattering structures may scatter incident light, increasing the average path length of the incident light within the semiconductor substrate. A longer average path length within the semiconductor substrate increases the chance of the incident near-infrared light being converted to an electron by the semiconductor substrate. This increases the sensitivity of the image sensor to near-infrared light.

Figure 7:
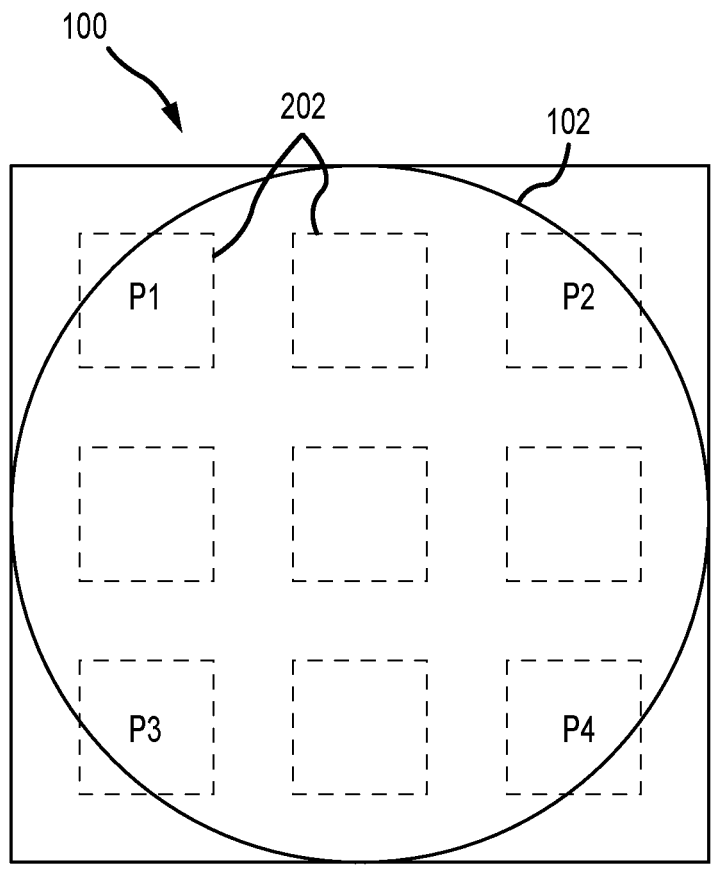
FIG. 7 is a top view of an illustrative phase detection pixel group with light-scattering structures for increased near-infrared light sensitivity in accordance with an embodiment.

FIG. 7 is a top view of an illustrative phase detection pixel group 100 that includes light scattering structures for increased near-infrared light sensitivity. As shown in FIG. 7, a plurality of light-scattering structures 202 are formed in the pixel group (e.g., over photosensitive areas P1, P2, P3, and P4. The example of nine light-scattering structures covering the phase detection pixel group is merely illustrative. In general, each photosensitive area may be covered by any desired number of light-scattering structures. A given light-scattering structure may overlap more than one photosensitive area.

Figure 8:
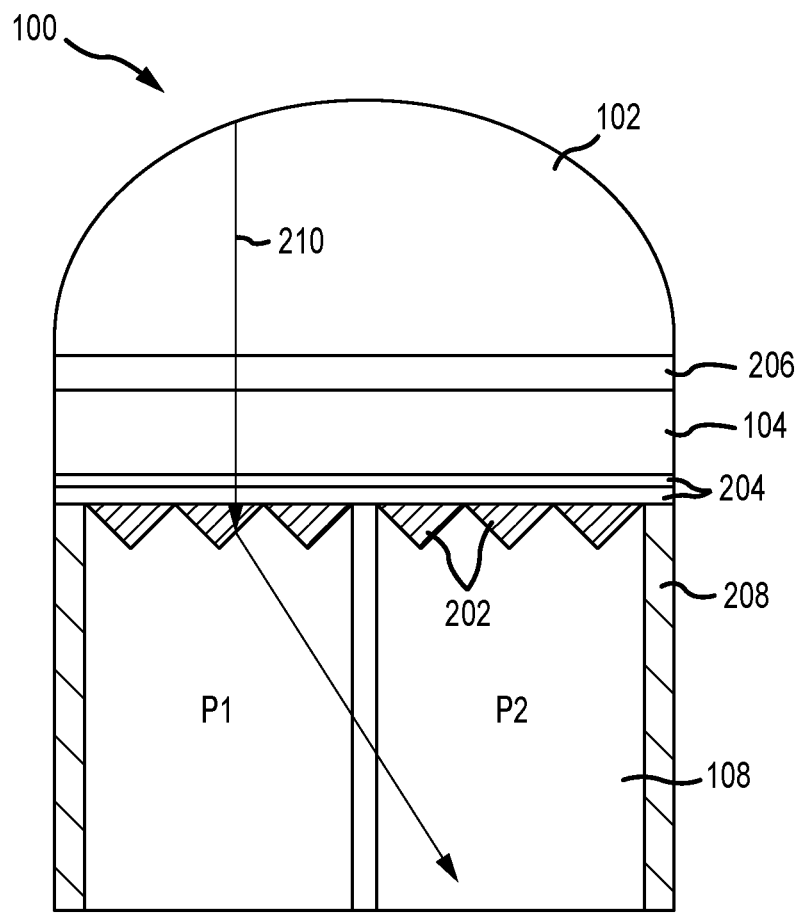
FIG. 8 is a cross-sectional side view of an illustrative phase detection pixel group with light-scattering structures for increased near-infrared light sensitivity in accordance with an embodiment.

A cross-sectional side view of an illustrative phase detection pixel group 100 that includes light scattering structures is shown in FIG. 8. As shown in FIG. 8, pixel group 100 includes photosensitive areas such as photosensitive areas P1 and P2 formed in substrate 108. Substrate 108 may be formed from silicon or another desired material (e.g., silicon germanium). Microlens 102 and a color filter element 104 may cover all of the photosensitive areas in the pixel group.

Additionally, pixel group 100 includes light-scattering structures 202 as shown in FIG. 8. The light-scattering structures may be formed from a transparent material that has a lower index of refraction than substrate 108, in one example. Substrate 108 may be etched to form pyramidal recesses (or recesses of any other desired shapes). A transparent material may fill the etched recesses to form the light-scattering structures. The light-scattering structures may have a cone shape, cylindrical shape, pyramidal shape or any other desired shape. Light-scattering structures 202 may have any desired dimensions. In some embodiments, the surface of substrate 108 may be textured, with the textured surface serving as light-scattering structures for enhanced near-infrared light sensitivity.

Additional passivation layers 204 may be formed between light-scattering structures 202 and color filter element 104. Passivation layers 204 may include silicon dioxide, tantalum oxide, potassium oxide, hafnium oxide, aluminum oxide, silicon nitride, etc. A planarization layer 206 may be interposed between color filter element 104 and microlens 102. Deep trench isolation (DTI) 208 may be formed around the periphery of the phase detection pixel group.

Light-scattering structures 202 may redirect incident light, increasing the path length of the incident light within the substrate. For example, consider incident light 210 in FIG. 8. The incident light is redirected by light-scattering structures 202. The incident light therefore travels a longer path within substrate 108 than if the incident light was not redirected. However, the incident light is redirected to pixel P2 instead of pixel P1. The light-scattering structures therefore reduce the sensitivity of phase detection pixel data from the phase detection pixel group.

Figure 9:
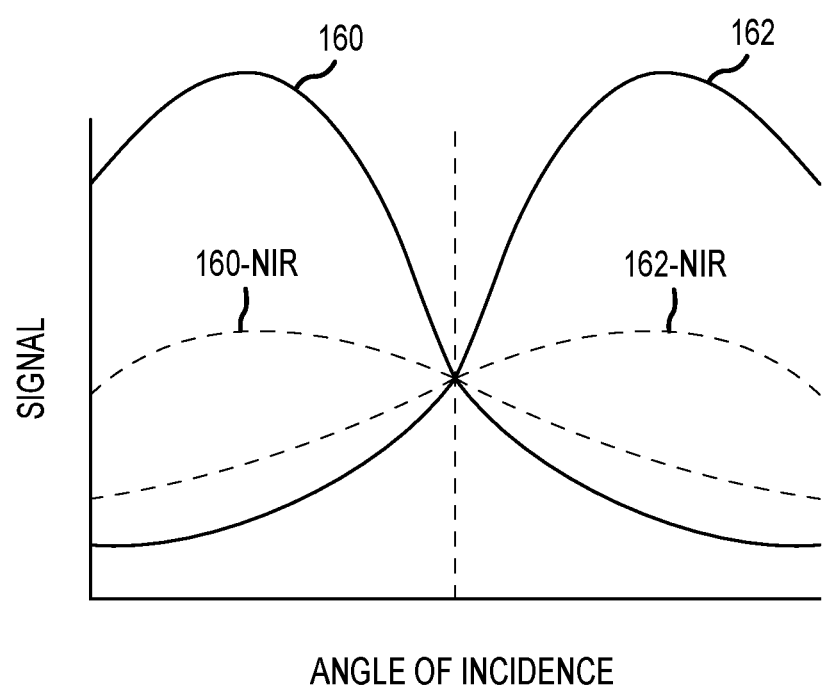
FIG. 9 is a diagram of illustrative signal outputs of phase detection pixels having light-scattering structures for increased near-infrared light sensitivity in accordance with an embodiment.

In the diagram of FIG. 9, an example of the pixel signal outputs of pixels P1 and P2 of pixel group 100 in response to varying angles of incident light is shown. Similar to as shown in connection with FIG. 3, line 160 may represent the output image signal for pixel P2 (in cases where NIR sensitivity enhancing light-scattering structures are not present) and line 162 may represent the output image signal for pixel P1 (in cases where NIR sensitivity enhancing light-scattering structures are not present). As shown in FIG. 9, without the light-scattering structures there is a large separation between the two signals 160 and 162. However, line 160-NIR represents the output image signal for pixel P2 in cases where NIR sensitivity enhancing light-scattering structures are present and line 162-NIR represents the output image signal for pixel P1 in cases where NIR sensitivity enhancing light-scattering structures are present. As shown, the difference between signals 160-NIR and 162-NIR is reduced compared to signals 160 and 162.

Therefore, while incorporating light-scattering structures into a phase detection pixel group may increase NIR sensitivity for the pixel group, it may decrease phase detection sensitivity for the pixel group. To achieve a balance between visible light detection performance, near-infrared light detection performance, and phase detection performance, light scattering structures may be incorporated into only some of the pixel groups in the image sensor. For example, in FIG. 6 the phase detection pixel groups are arranged according to a Bayer color filter pattern (with a red, blue, and two green phase detection pixel groups in each repeating unit cell). In one option, the red phase detection pixel group, the blue phase detection pixel group, and one of the green phase detection pixel groups of each repeating unit cell may include light-scattering structures and one of the green phase detection pixel groups of each repeating unit cell may not include light-scattering structures. In this arrangement, NIR sensitivity is prioritized over phase detection sensitivity. In another arrangement, only one green phase detection pixel group of each repeating unit cell may include light-scattering structures. In this arrangement, phase detection sensitivity is prioritized over NIR sensitivity. In some cases, one green color filter element may be replaced with an infrared color filter element in each unit cell for enhanced NIR sensitivity.

In other embodiments, each phase detection pixel group may be designed to include light-scattering structures that increase NIR sensitivity while minimizing disruptions of phase detection and visible light performance.

Figure 10A:
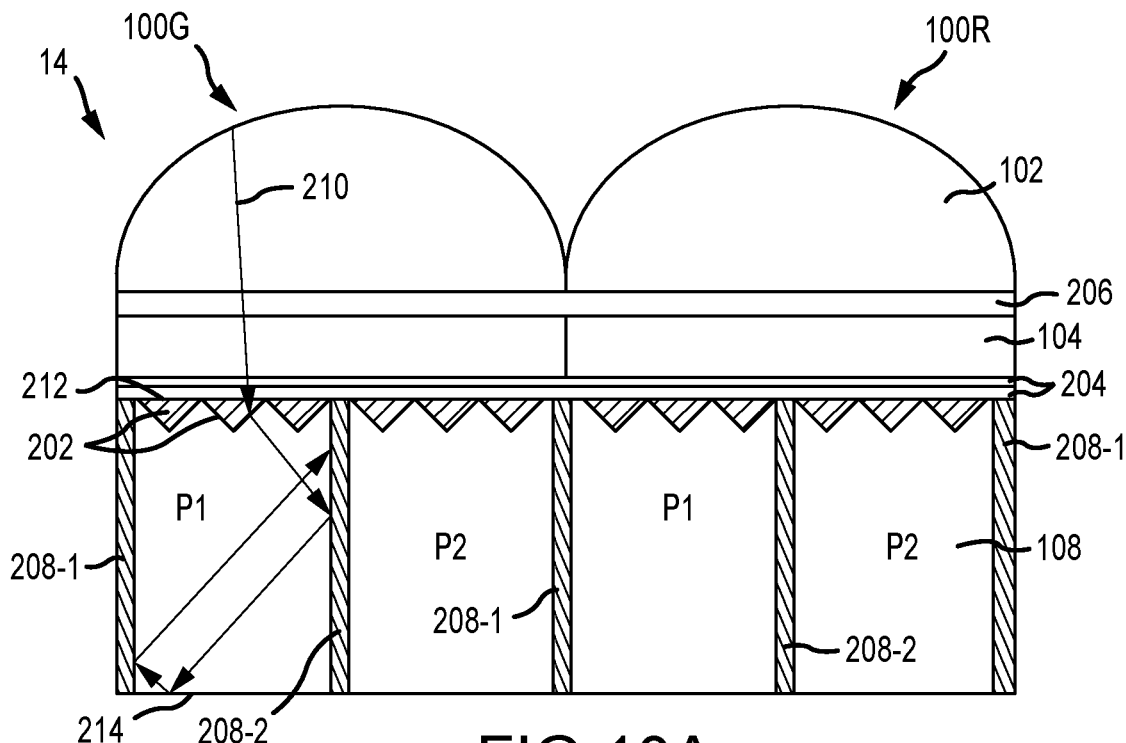
FIG. 10A is a cross-sectional side view of an illustrative image sensor having phase detection pixel groups with deep trench isolation between photosensitive areas within the phase detection pixel groups in accordance with an embodiment.

FIG. 10A is a cross-sectional side view of an illustrative image sensor with phase detection pixel groups having increased NIR sensitivity with mitigated disruptions to phase detection performance and visible light sensitivity. As shown in FIG. 10A, each phase detection pixel group has a similar structure to the phase detection pixel group of FIG. 8. A microlens 102 covers a respective color filter element 104 and photosensitive areas (e.g., four photosensitive areas in a 4×4 arrangement). Planarization layer 206 is interposed between color filter elements 104 and microlenses 102. Light scattering structures 202 are formed in substrate 108. Additional passivation layers 204 (silicon dioxide, tantalum oxide, potassium oxide, hafnium oxide, aluminum oxide, silicon nitride, etc.) may be formed between light-scattering structures 202 and color filter element 104.

Similar to as in FIG. 8, the phase detection pixel groups of FIG. 10A include deep trench isolation 208-1 formed between each adjacent pair of phase detection pixel groups (e.g., inter-group DTI). However, the phase detection pixel groups also include intra-group deep trench isolation 208-2. As shown in FIG. 10A, deep trench isolation 208-2 may be interposed between the respective photosensitive areas of a given phase detection pixel group. Deep trench isolation 208-1 and 208-2 may be backside deep trench isolation (BDTI) or front side deep trench isolation (FDTI).

Backside deep trench isolation may be formed by etching a trench in the back surface 212 of substrate 108 from back surface 212 towards front surface 214. A coating, oxide layer (e.g., silicon dioxide layer), and/or an opaque layer may optionally fill the BDTI trench. Front side deep trench isolation (FDTI) structures may be formed by etching trenches into substrate 108 from front surface 214 towards back surface 212. The trench is then filled with material that aids in isolating adjacent photosensitive areas. For example, the FDTI trenches may be filled with filler material such as polysilicon, one or more coatings, an oxide layer, an opaque layer, and/or any other desired materials.

Forming DTI 208-2 between adjacent photosensitive areas of the phase detection pixel group enables light scattering for improved NIR sensitivity while maintaining phase detection performance. For example, as shown in FIG. 10A, incident light may be redirected by light-scattering structures 202. Without the presence of intra-group DTI 208-2 (e.g., as in FIG. 8), incident light 210 would be undesirably redirected from P1 to P2. However, in FIG. 10A, DTI 208-2 reflects the incident light and keeps the incident light within P1. The light-scattering structures improve NIR sensitivity by redirecting the light and increasing the path length of the incident light. The DTI preserves phase detection performance by reducing cross-talk between photosensitive areas caused by the light-scattering.

Figure 10B:
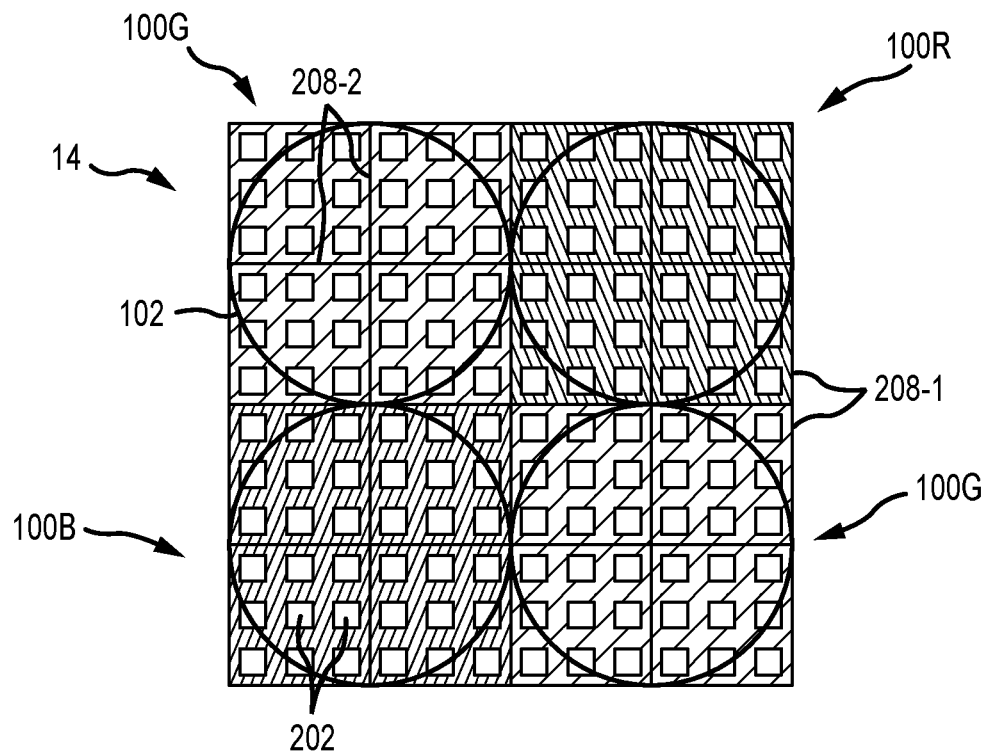
FIG. 10B is a top view of the illustrative image sensor of FIG. 10A in accordance with an embodiment.

FIG. 10B is a top view of the image sensor of FIG. 10A. FIG. 10B shows a unit cell of phase detection pixel groups that may be repeated across the pixel array. In FIG. 10B, two green phase detection pixel groups 100G, one red phase detection pixel group 100R, and one blue phase detection pixel group 100B are arranged in a 2×2 unit cell. Each phase detection pixel group includes four pixels in a 2×2 arrangement (similar to as shown in FIG. 6). In some cases, phase detection pixel groups with a 2×2 arrangement of pixels (or photosensitive areas) may instead be referred to as phase detection pixels with a 2×2 arrangement of sub-pixels (or photosensitive areas).

As shown in FIG. 10B, DTI 208-1 is formed between adjacent phase detection pixel groups and DTI 208-2 is formed between adjacent photosensitive areas within each phase detection pixel groups.

In FIG. 10B, each photosensitive area is covered by a respective plurality (e.g., 3×3 arrangement) of light-scattering structures 202. This example is merely illustrative. In general, each photosensitive area may be covered by any desired number of light-scattering structures having any desired shape. Similarly, the example of FIG. 10B of each phase detection pixel group including a 2×2 arrangement of photosensitive areas is merely illustrative. Each phase detection pixel group may include a 1×2 arrangement of photosensitive areas, a 3×3 arrangement of photosensitive areas, or any other desired arrangement of photosensitive areas.

Additionally, the example in FIG. 10B of having a Bayer color filter pattern (e.g., with one red, one blue, and two green color filter elements) over the phase detection pixel groups is merely illustrative. In alternate embodiments, one of the green color filter elements may instead be an infrared color filter element. Other color filter patterns (e.g., red, yellow, yellow, cyan) may be used if desired.

Figure 11A:
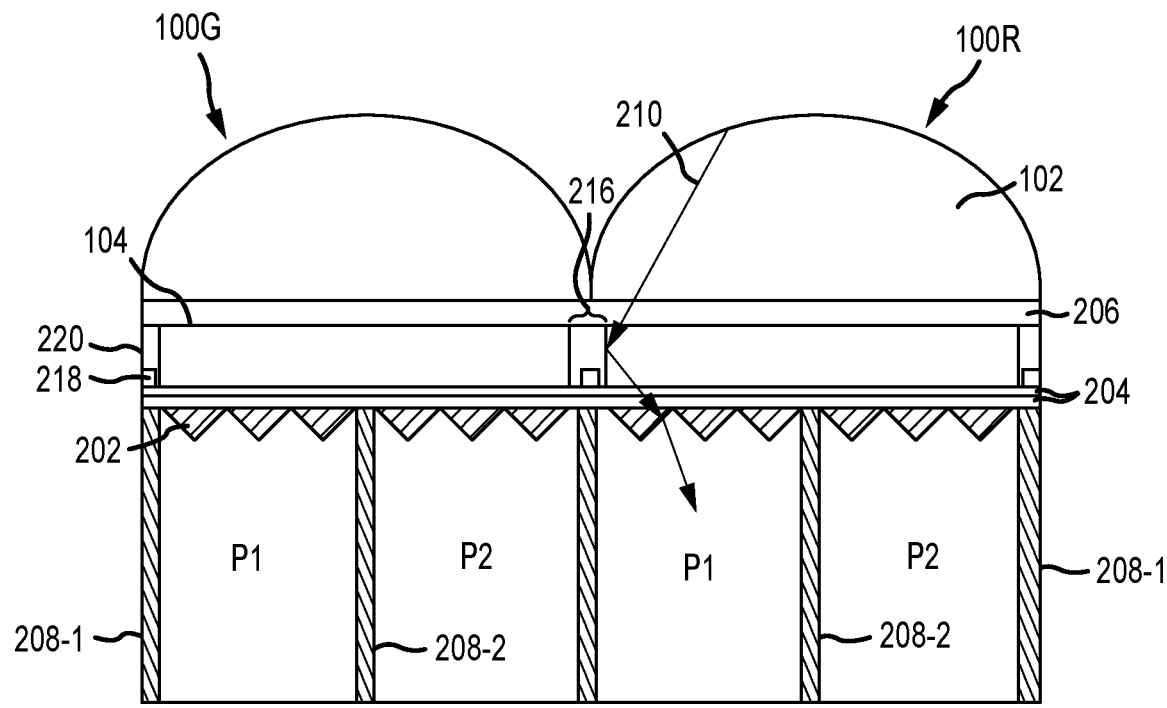
FIG. 11A is a cross-sectional side view of an illustrative image sensor having a composite grid between color filter elements in accordance with an embodiment.
Figure 11B:
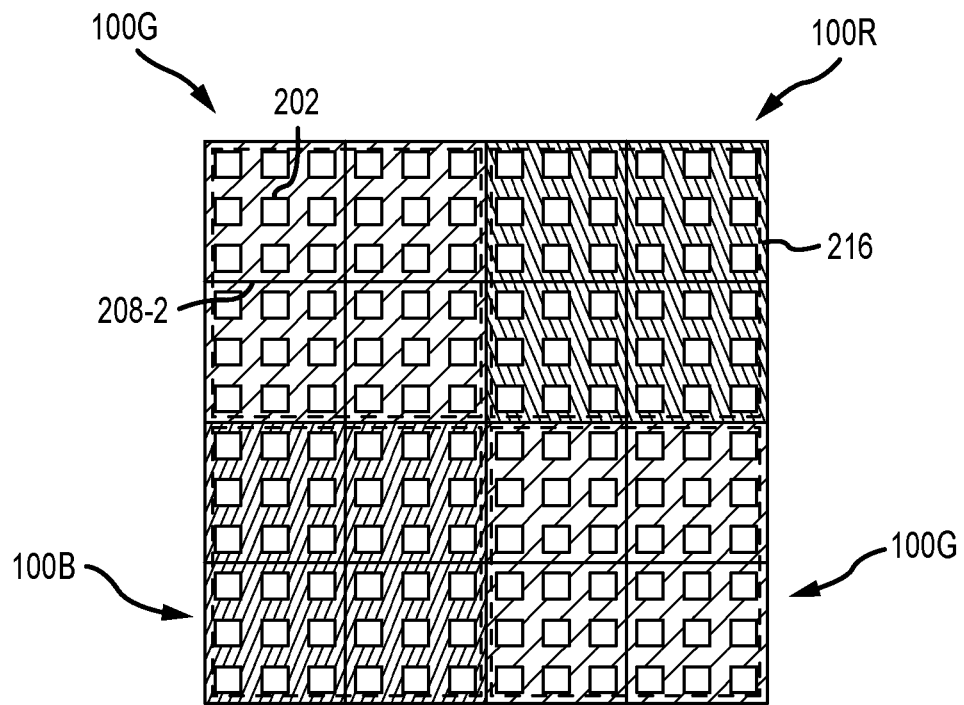
FIG. 11B is a top view of the illustrative image sensor of FIG. 11A in accordance with an embodiment.

In some embodiments, a composite grid may be formed between adjacent color filter elements in the image sensor. FIG. 11A is a cross-sectional side view of an illustrative image sensor with a composite grid 216 between adjacent color filter elements 104. As shown in FIG. 11B, composite grid 216 may be formed between each adjacent pair of phase detection pixel groups 100. The composite grid 216 may include a metal portion 218 (e.g., formed from tungsten or another desired material) and an oxide portion 220 (e.g., formed from silicon dioxide or another desired material). The composite grid 216 may sometimes be referred to as a reflective grid. The composite grid may prevent crosstalk between phase detection pixel groups.

Figure 12A:
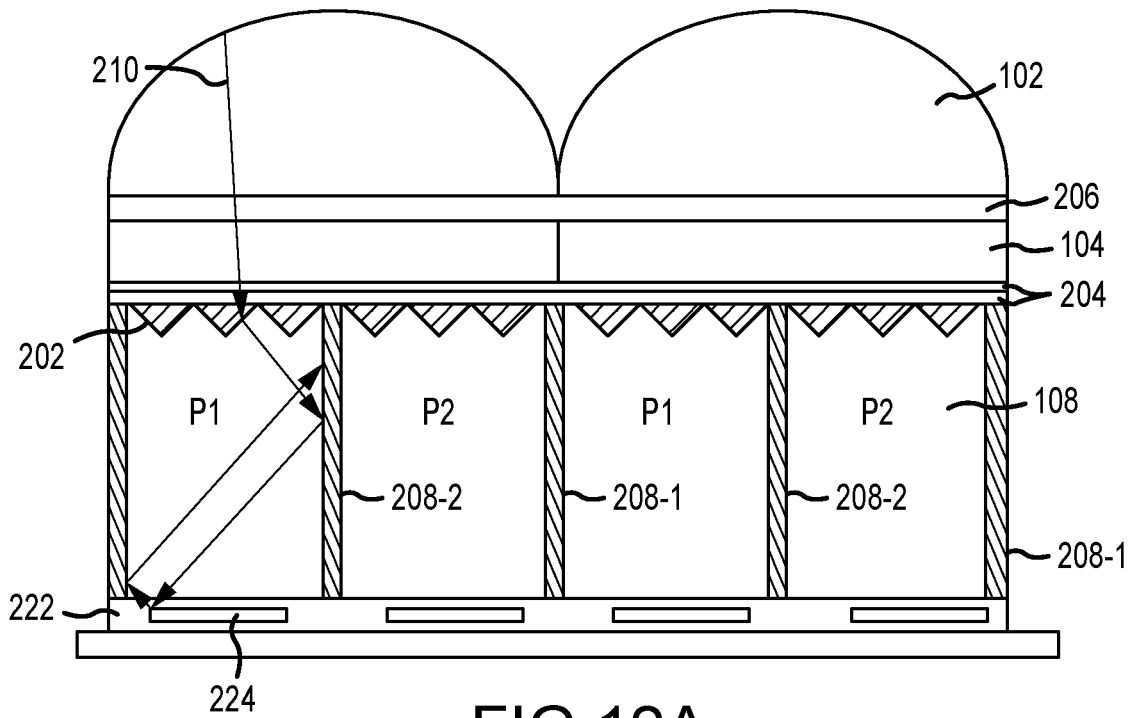
FIG. 12A is a cross-sectional side view of an illustrative image sensor having phase detection pixel groups with front side reflectors in accordance with an embodiment.

A reflective layer may optionally be included at the front surface of the substrate if desired. FIG. 12A is a cross-sectional side view of an image sensor with front side reflectors. As shown in FIG. 12A, front side reflectors 224 may be formed in dielectric layer 222 on the front side of substrate 108. Each reflector 224 may overlap a respective photosensitive area of the phase detection pixel groups. Reflectors 224 may be formed from any desired material (e.g., titanium or aluminum). The reflectors may reflect more than 40% of incident light, more than 60% of incident light, more than 80% of incident light, more than 80% of incident light, more than 90% of incident light, more than 95% of incident light, etc. Dielectric layer 222 may sometimes be referred to as a passivation layer and may be formed from any desired material. In some cases, reflectors 224 may be formed from a dielectric material that reflects light using total internal reflection (TIR). Reflectors 224 may be referred to as reflective layers.

Figure 12B:
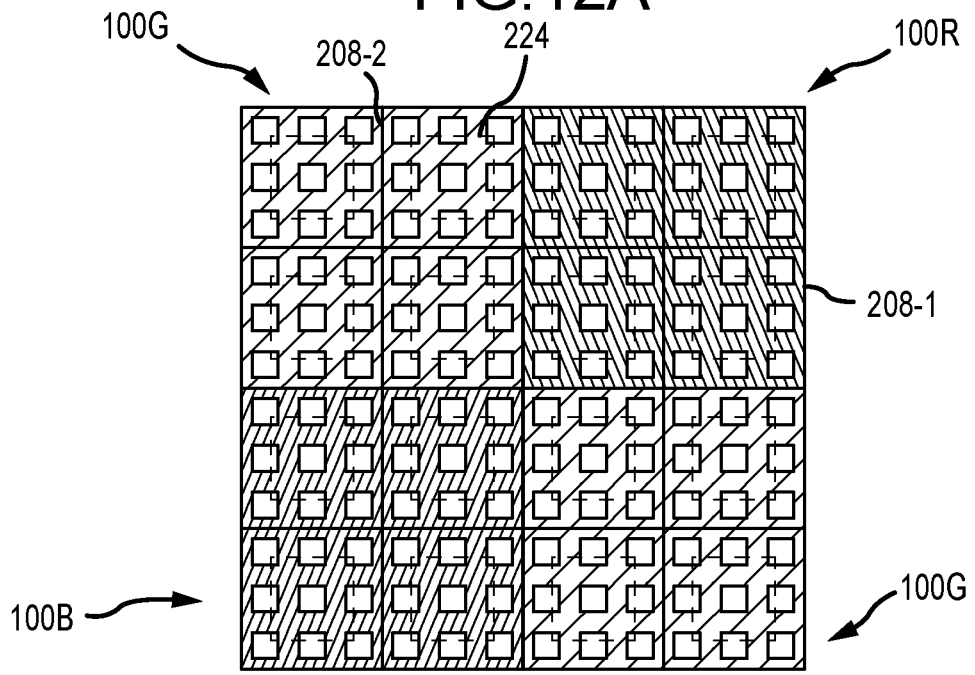
FIG. 12B is a top view of the illustrative image sensor of FIG. 12A in accordance with an embodiment.

In FIGS. 12A and 12B, each photosensitive area overlaps a corresponding discrete reflector 224. This example is merely illustrative. If desired, a continuous reflective layer may extend across multiple photosensitive areas on the front side of the substrate (e.g., across an entire phase detection pixel group, across the entire repeating unit cell of phase detection pixel groups, across the entire pixel array, etc.). However, splitting the reflective layer into discrete reflectors with one reflector per photosensitive area may reduce mechanical stresses within the image sensor and may mitigate cross-talk between photosensitive areas.

Reflectors 224 may reflect light that has already passed through the photosensitive area back into the photosensitive area. This effectively increases the average path length of incident light for the image sensor, increasing the sensitivity to near-infrared light. However, because the incident light is contained within each photosensitive area by DTI 208-1 and 208-2, phase detection performance is preserved.

Figure 13A:
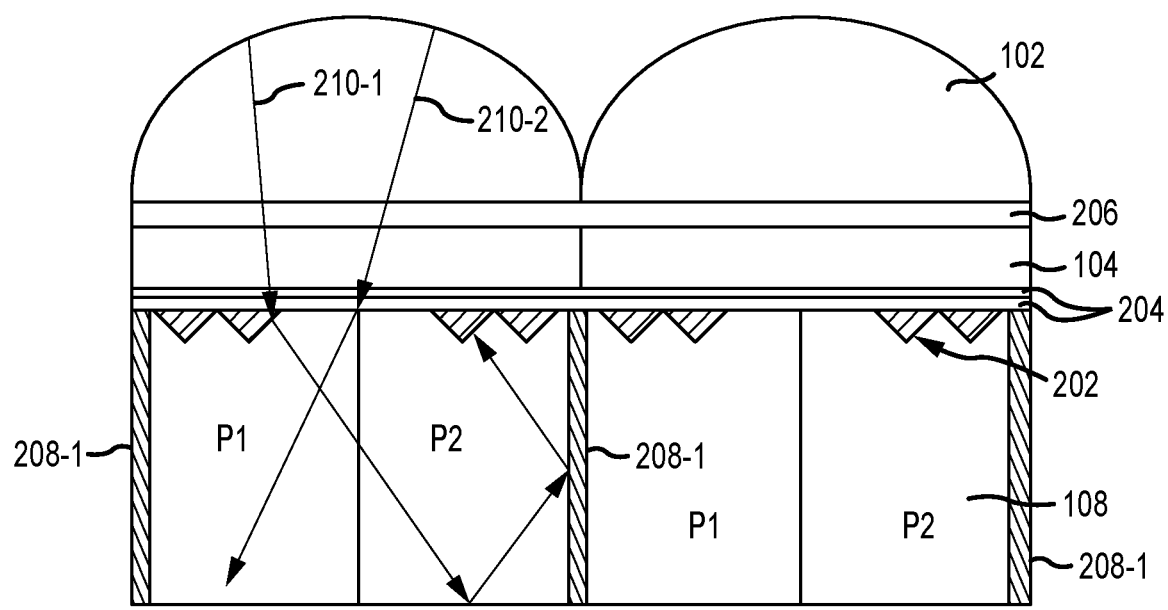
FIG. 13A is a cross-sectional side view of an illustrative image sensor having phase detection pixel groups with unevenly distributed light-scattering structures in accordance with an embodiment.
Figure 13B:
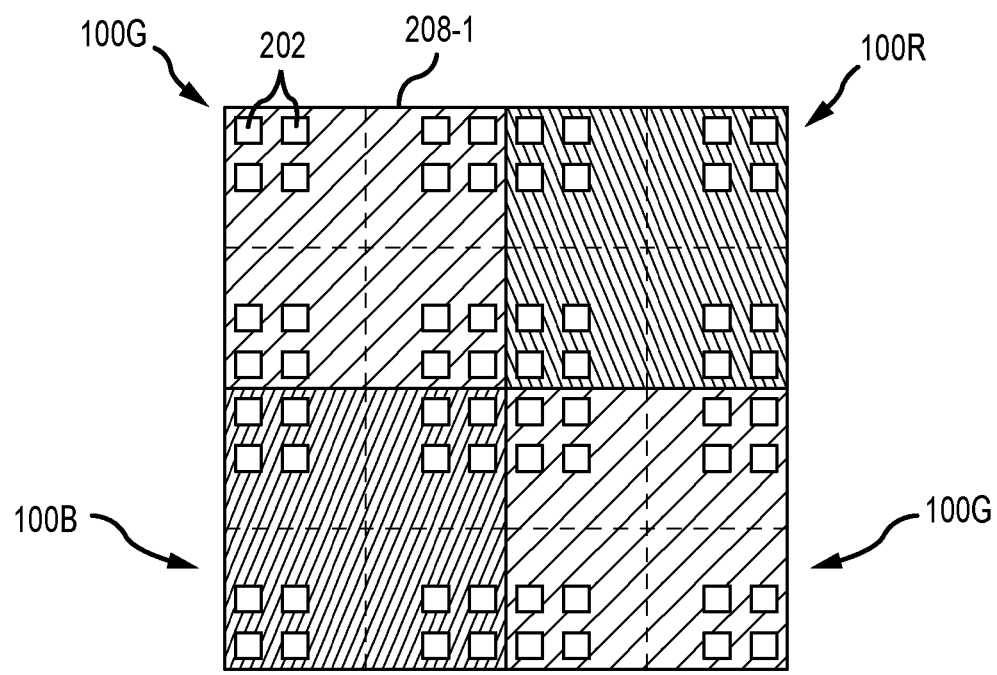
FIG. 13B is a top view of the illustrative image sensor of FIG. 13A in accordance with an embodiment.

In some cases, light-scattering structures may be selectively applied over each photosensitive area. An example of this type is shown in FIGS. 13A and 13B. As shown in FIGS. 13A and 13B, light-scattering structures 202 may be selectively grouped in the corners of each phase detection pixel group. This allows incident light towards the corners of the phase detection pixel group (e.g., incident light 210-1 in FIG. 13A) to be scattered for improved near-infrared light sensitivity. However, omitting the light-scattering structures in the center of the phase detection pixel group may allow for incident light at the center of the phase detection pixel group (e.g., incident light 210-2 in FIG. 13A) to pass undisturbed by the light-scattering structures, preserving the asymmetric angular response of the pixels. Omitting light-scattering structures in this manner effectively sacrifices some NIR sensitivity in exchange for improved phase detection performance.

The top view of FIG. 13B shows how light-scattering structures 202 may be formed at the corners of the phase detection pixel group and omitted towards the center of the phase detection pixel group. In FIGS. 10-12, the light-scattering structures 202 are uniformly distributed across the phase detection pixel group (e.g., the number of light-scattering structures per unit area is consistent across the phase detection pixel group). In FIGS. 13A and 13B, light-scattering structures 202 are non-uniformly distributed across the phase detection pixel group (e.g., the number of light-scattering structures per unit area is inconsistent across the phase detection pixel group).

Figure 14A:
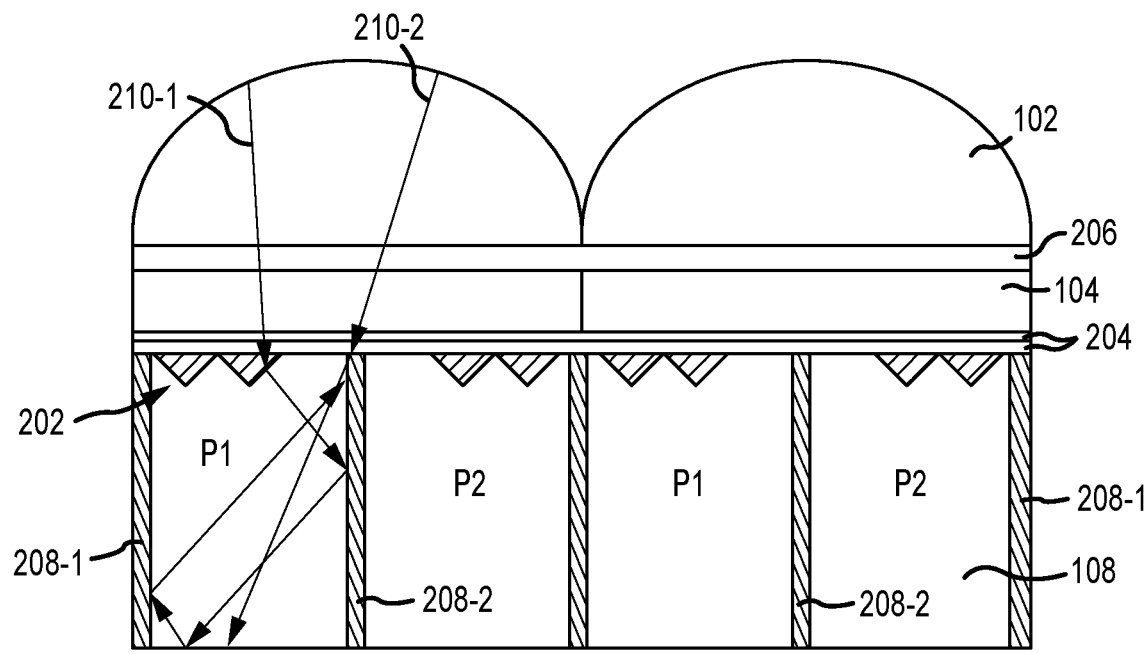
FIG. 14A is a cross-sectional side view of an illustrative image sensor having phase detection pixel groups with deep trench isolation between photosensitive areas within the phase detection pixel groups and unevenly distributed light-scattering structures in accordance with an embodiment.
Figure 14B:
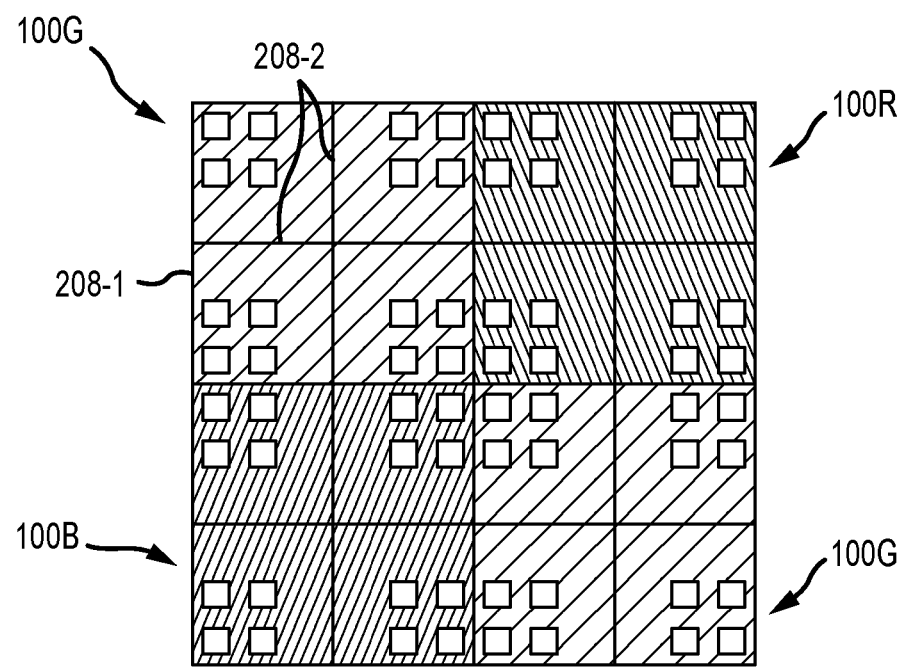
FIG. 14B is a top view of the illustrative image sensor of FIG. 14A in accordance with an embodiment.

Intra-group deep trench isolation (similar to as shown in FIG. 10A) may be incorporated into the image sensor of FIG. 13A. An embodiment of this type is shown in FIG. 14A. The image sensor of FIG. 14A includes both a non-uniform distribution of light-scattering structures 202 and intra-group DTI 208-2. DTI 208-2 (which may be front side deep trench isolation or backside deep trench isolation) may help contain incident light that is scattered by the light-scattering structures (e.g., incident light 210-1) within the appropriate photosensitive area to obtain phase detection data.

Figure 15A:
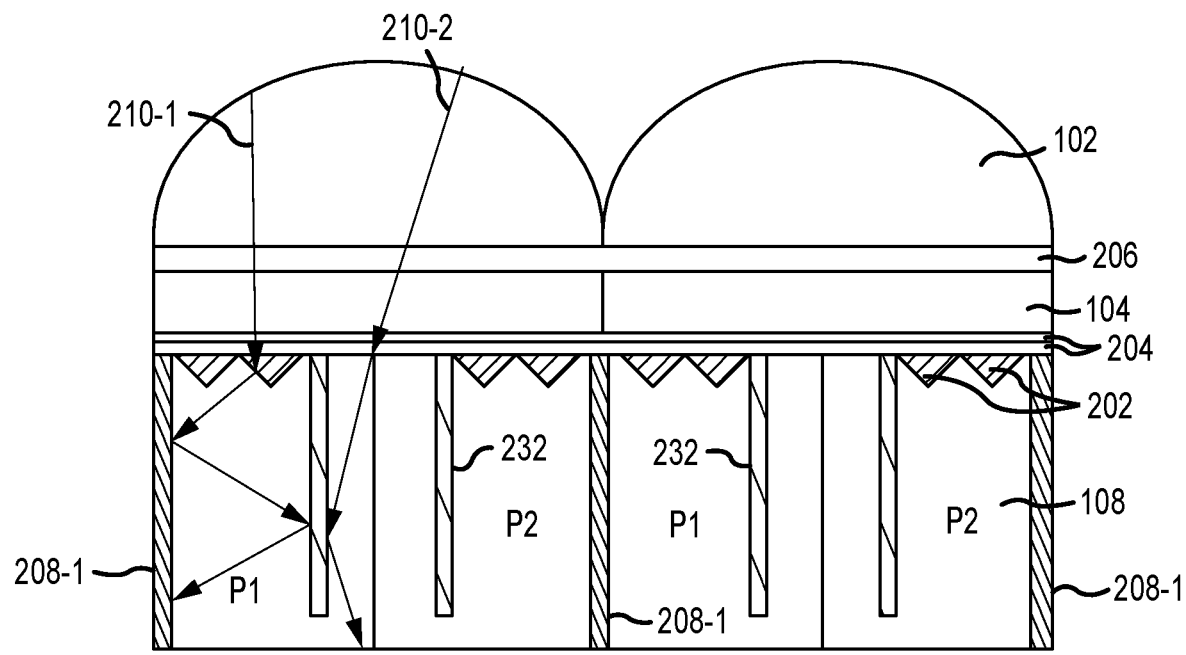
FIG. 15A is a cross-sectional side view of an illustrative image sensor having phase detection pixel groups with backside deep trench isolation formed in a ring around a central portion of the phase detection pixel group in accordance with an embodiment.
Figure 15B:
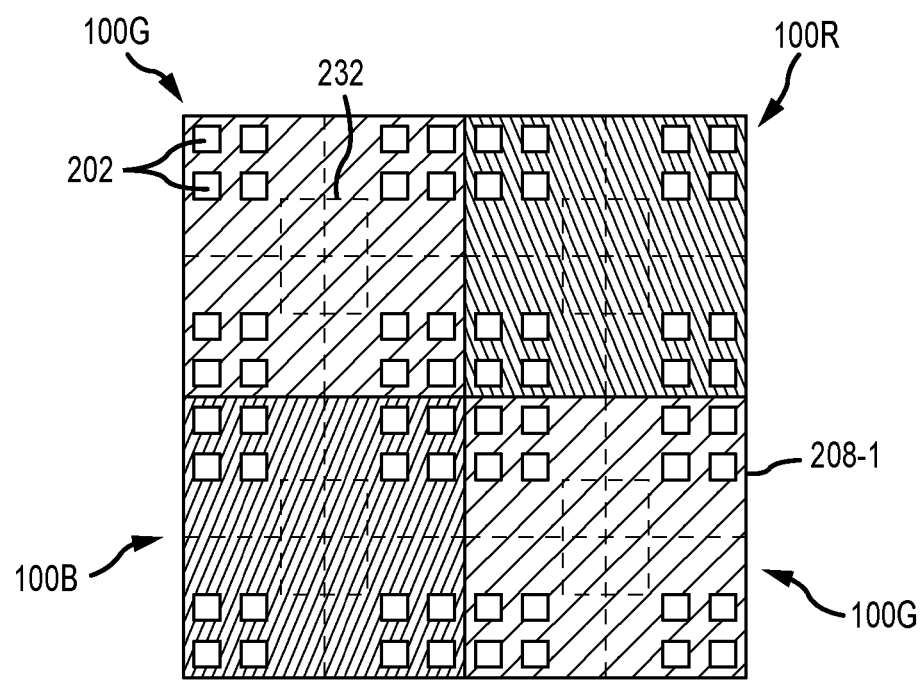
FIG. 15B is a top view of the illustrative image sensor of FIG. 15A in accordance with an embodiment.

FIGS. 15A and 15B show another embodiment where light-scattering structures 202 are selectively grouped in the corners of each phase detection pixel group. In addition, backside deep trench isolation (BDTI) 232 may be formed in a ring-shape around the center of the phase detection pixel group. The top view of FIG. 15B shows how BDTI 232 may be ring-shaped (annular) such that the BDTI laterally surrounds the center of the phase detection pixel group. The BDTI may separate a central portion of the phase detection pixel group (that is not overlapped by any light-scattering structures) from a peripheral portion of the phase detection pixel group (that is overlapped by the non-uniformly distributed light-scattering structures).

The backside deep trench isolation may be formed by etching a trench in the back surface of substrate 108 from the back surface towards the front surface. A coating, oxide layer (e.g., silicon dioxide layer), and/or an opaque layer may optionally fill the BDTI trench. BDTI 232 may prevent incident light (e.g., 210-1) that is scattered by light-scattering structures 202 from crossing between photosensitive areas.

Figure 16A:
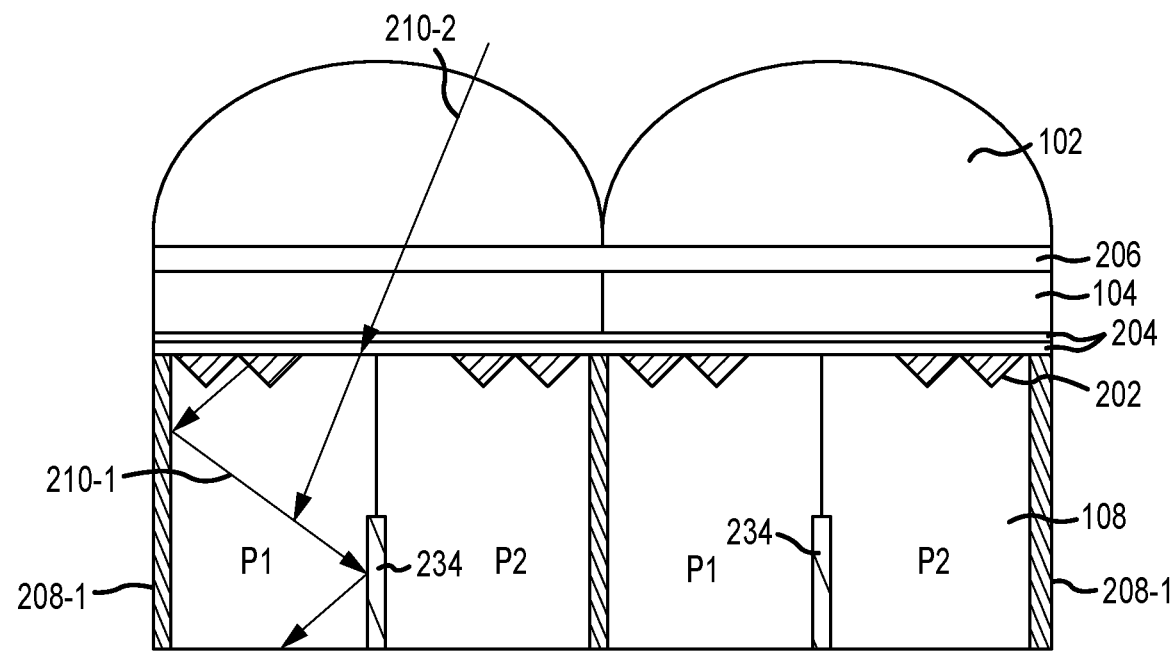
FIG. 16A is a cross-sectional side view of an illustrative image sensor having phase detection pixel groups with front side deep trench isolation between photosensitive areas within the phase detection pixel groups in accordance with an embodiment.
Figure 16B:
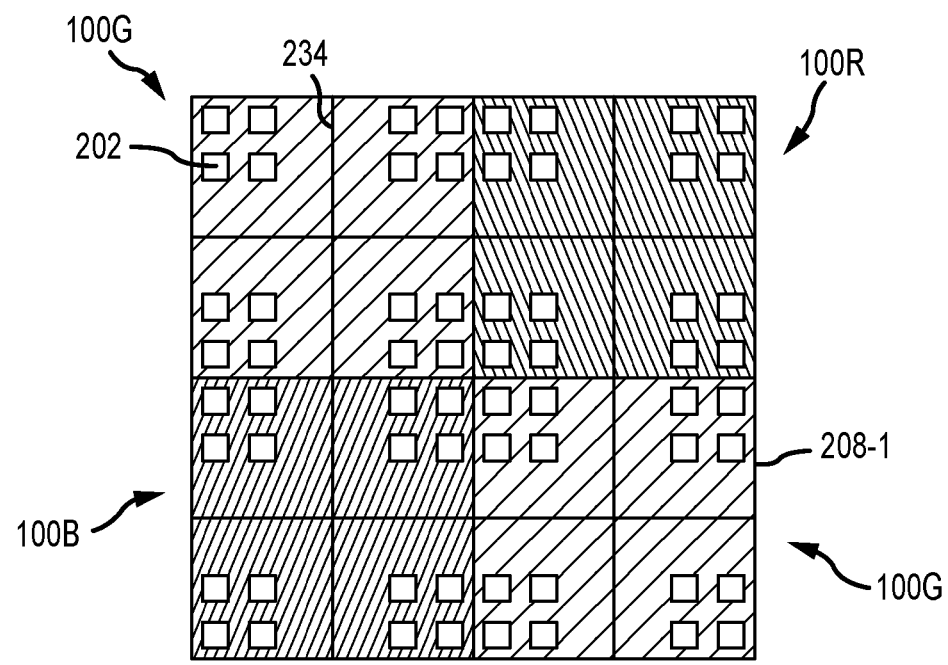
FIG. 16B is a top view of the illustrative image sensor of FIG. 16A in accordance with an embodiment.

In another possible embodiment, front side deep trench isolation (FDTI) may be formed in a grid between adjacent photosensitive regions within a single phase detection pixel group. FIGS. 16A and 16B show an image sensor 14 with FDTI 234. Forming FDTI 234 between adjacent photosensitive areas of the phase detection pixel group enables light scattering for improved NIR sensitivity while maintaining phase detection performance. For example, as shown in FIG. 16A, incident light 210-1 may be redirected by light-scattering structures 202. Without the presence of intra-group FDTI 234, incident light 210-1 would be undesirably redirected from P1 to P2. However, in FIG. 16A, FDTI 234 reflects the incident light and keeps the incident light within P1. The light-scattering structures improve NIR sensitivity by redirecting the light and increasing the path length of the incident light. The FDTI preserves phase detection performance by reducing cross-talk between photosensitive areas caused by the light-scattering.

In FIG. 16B, as in FIG. 13B for example, light-scattering structures 202 may be formed at the corners of the phase detection pixel group and omitted towards the center of the phase detection pixel group.

Front side deep trench isolation (FDTI) 234 may be formed by etching trenches into substrate 108 from the front surface of the substrate towards the back surface of the substrate. The trench is then filled with material that aids in isolating adjacent photosensitive areas. For example, the FDTI trenches may be filled with filler material such as polysilicon, one or more coatings, an oxide layer, an opaque layer, and/or any other desired materials. In one example, DTI 208-1 formed between adjacent phase detection pixel groups may also be FDTI. Alternatively, DTI 208-1 may be BDTI. If DTI 208-1 is FDTI, DTI 208-1 and FDTI 234 may be formed in the same manufacturing step. When etching the trenches for FDTI, a wider trench will etch to a deeper depth in the same amount of time. Therefore, FDTI 234 may be narrower than DTI 208-1. When etched for the same amount of time, the length of the DTI 208-1 trench will be longer than the length of the FDTI 234 trench. The example of FDTI 234 having a smaller width and a shorter depth than DTI 208-1 is merely illustrative. In general, FDTI 234 may have any desired dimensions.

Figure 17A:
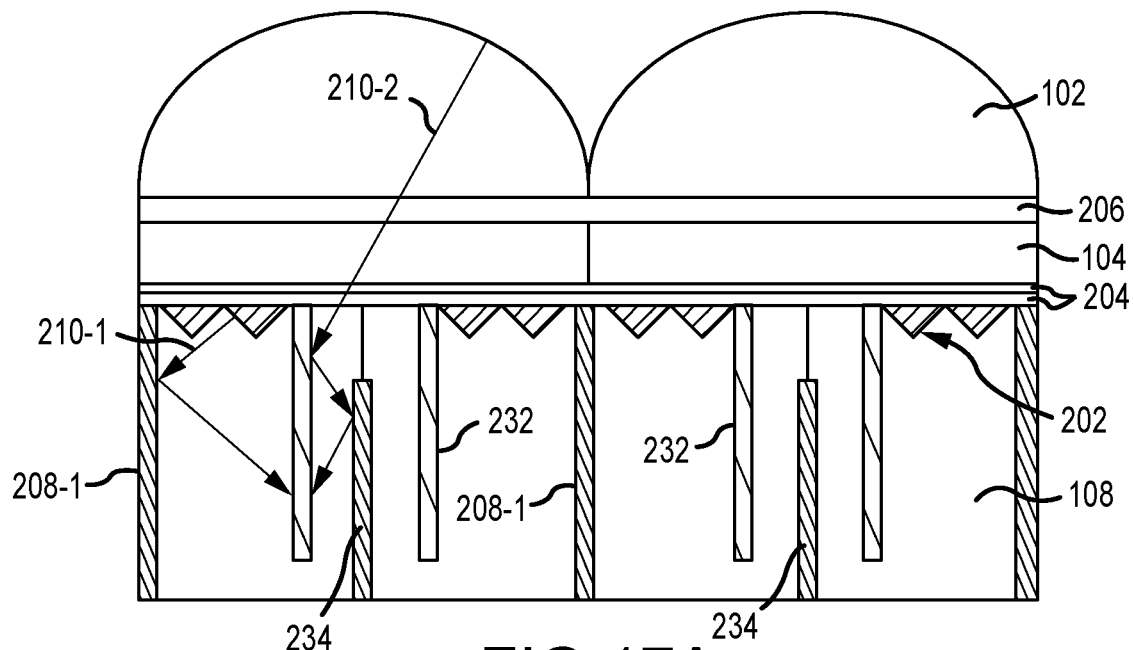
FIG. 17A is a cross-sectional side view of an illustrative image sensor having phase detection pixel groups with front side deep trench isolation between photosensitive areas within the phase detection pixel groups, unevenly distributed light-scattering structures, and backside deep trench isolation formed in a ring around a central portion of the phase detection pixel group in accordance with an embodiment.
Figure 17B:
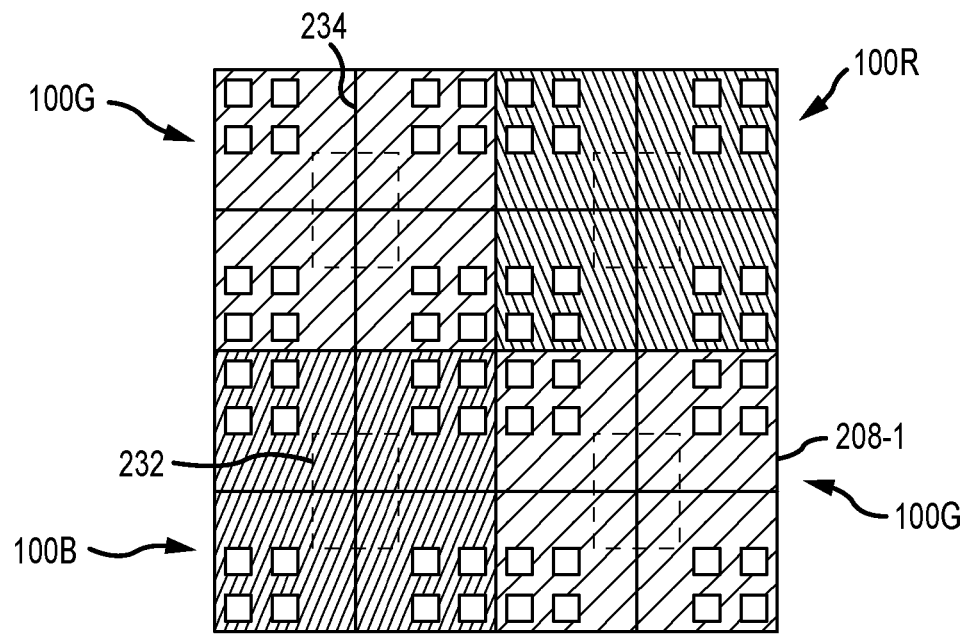
FIG. 17B is a top view of the illustrative image sensor of FIG. 17A in accordance with an embodiment.

FIGS. 17A and 17B show an illustrative embodiment that includes the non-uniform distribution of light-scattering structures of FIG. 13A, the BDTI of FIG. 15A, and the FDTI of FIG. 16A. The presence of FDTI 234 and BDTI 232 may prevent cross-talk of incident light 210-2 at the center of the phase detection pixel group. Similar to previous embodiments the light 210-1 at the edge of the phase detection pixel group is contained within a respective photosensitive area by BDTI 232.

In FIGS. 10-17, each photosensitive area may be covered by any desired number of light-scattering structures having any desired shape. The light-scattering structures may be arranged with a uniform or non-uniform density. Similarly, the example of FIGS. 10-17 of each phase detection pixel group including a 2×2 arrangement of photosensitive areas is merely illustrative. Each phase detection pixel group may include a 1×2 arrangement of photosensitive areas, a 3×3 arrangement of photosensitive areas, or any other desired arrangement of photosensitive areas.

Additionally, the example in FIGS. 10-17 of having a Bayer color filter pattern (e.g., with one red, one blue, and two green color filter elements) over the phase detection pixel groups is merely illustrative. In alternate embodiments, one of the green color filter elements may instead be an infrared color filter element. Other color filter patterns (e.g., red, yellow, yellow, cyan) may be used if desired.

Any desired combination of the previous embodiments may be used in a single image sensor if desired. For example, the intra-group DTI of FIGS. 10A and 10B may be applied to any of the embodiments herein, the reflective grid of FIGS. 11A and 11B may be applied to any of the embodiments herein, the front side reflectors of FIGS. 12A and 12B may be applied to any of the embodiments herein, etc. Examples of DTI depths shown in FIGS. 10-17 are merely illustrative. Deep trench isolation need not extend entirely between the front and back surfaces of the substrate 108. The deep trench isolation may extend only partially between the front and back surfaces of substrate 108.

Figure 18A:
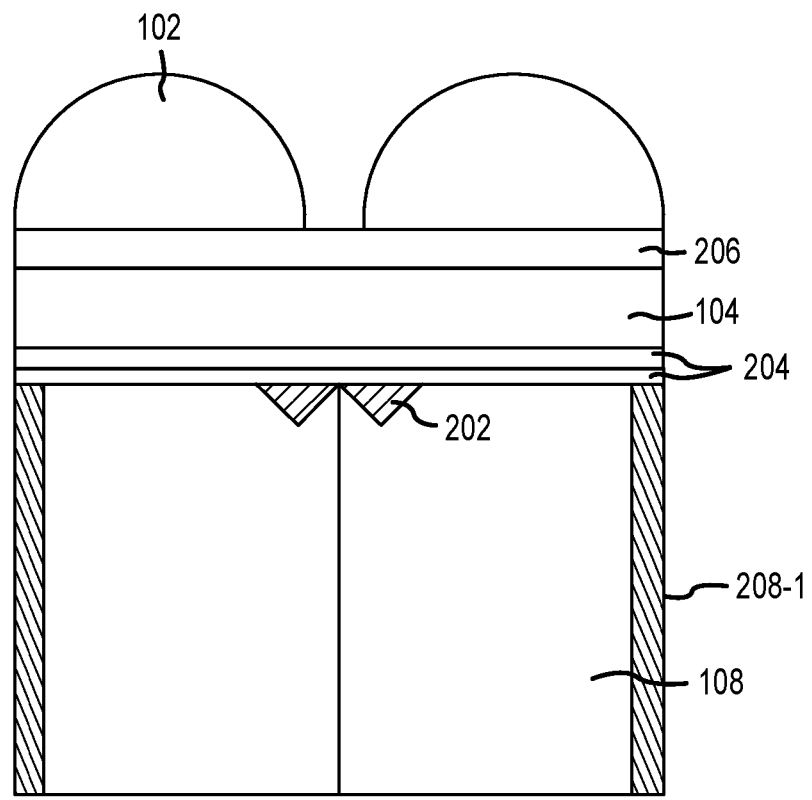
FIG. 18A is a cross-sectional side view of an illustrative phase detection pixel group that includes a microlens with an opening and light-scattering structures that are overlapped by the opening in accordance with an embodiment.
Figure 18B:
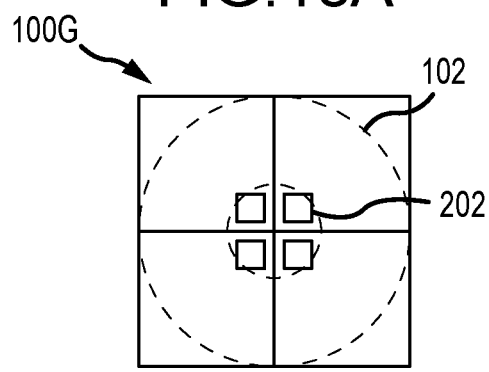
FIG. 18B is a top view of the illustrative phase detection pixel group of FIG. 18A in accordance with an embodiment.

In some cases, a microlens having an opening such as toroidal microlens 102 (sometimes referred to as a ring-shaped microlens or annular microlens) may be used in the image sensor. Microlenses of other shapes that include openings (e.g., a clover-shape with a central opening) may also be used if desired. When a toroidal microlens is used, longer wavelengths of light (e.g., NIR light) may preferentially pass through the opening of the microlens. Therefore, light-scattering structures 202 may be selectively placed under the opening in the microlens as shown in FIGS. 18A and 18B. The NIR light passing through the opening in the microlens will therefore be scattered by light-scattering structures 202, increasing NIR sensitivity. The visible light passing through the microlens material of microlens 102 will not be scattered by light-scattering structures 102, preserving phase detection performance.

Figure 19A:
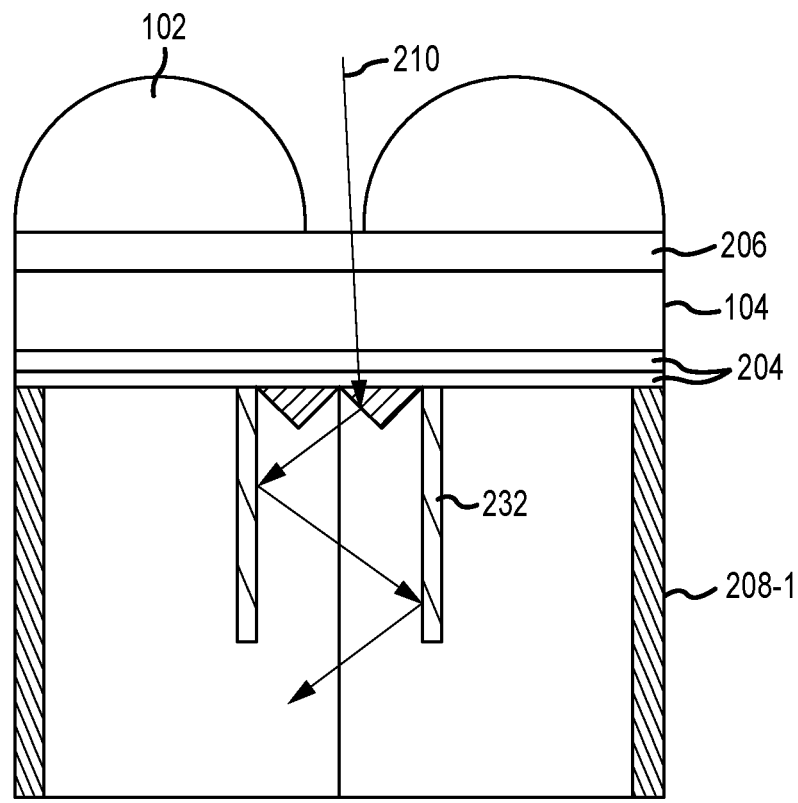
FIG. 19A is a cross-sectional side view of an illustrative phase detection pixel group that include a microlens with an opening, light-scattering structures that are overlapped by the opening, and backside deep trench isolation that extends in a ring around the light-scattering structures in accordance with an embodiment.
Figure 19B:
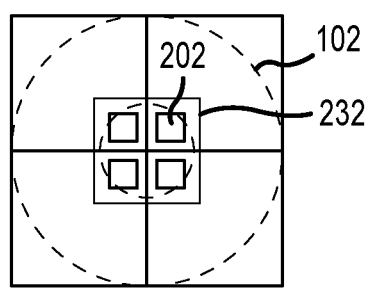
FIG. 19B is a top view of the illustrative phase detection pixel group of FIG. 19A in accordance with an embodiment.

In another embodiment, shown in FIGS. 19A and 19B, BDTI may be incorporated into the substrate when the phase detection pixel includes a toroidal microlens. As shown in FIGS. 19A and 19B, BDTI 232 may have a ring-shape that laterally surrounds a central portion of the phase detection pixel group. The central portion of the substrate (within BDTI 232) may be overlapped by light-scattering structures 202 and the opening in microlens 102. The peripheral portion of the phase detection pixel group (outside of BDTI 232) may not be overlapped by any light-scattering structures and may be overlapped by microlens material of microlens 102. The BDTI of FIG. 19A may improve phase detection performance in the image sensor.

Figure 20A:
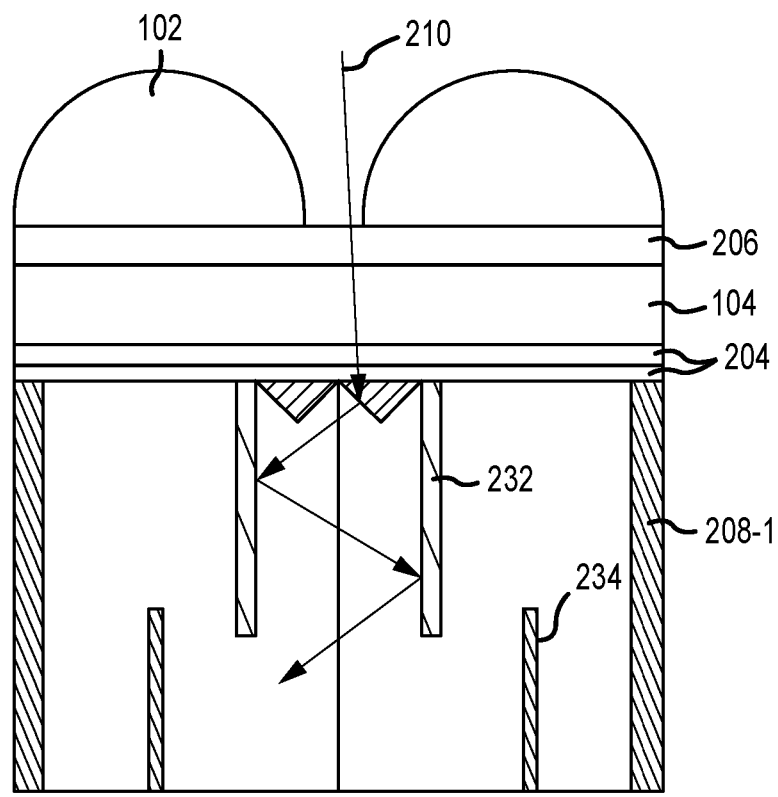
FIG. 20A is a cross-sectional side view of an illustrative phase detection pixel group that include a microlens with an opening, light-scattering structures that are overlapped by the opening, backside deep trench isolation that extends in a ring around the light-scattering structures, and front side deep trench isolation that extends in a ring around the backside deep trench isolation in accordance with an embodiment.
Figure 20B:
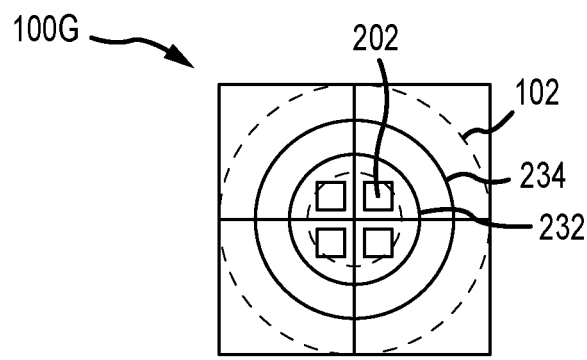
FIG. 20B is a top view of the illustrative phase detection pixel group of FIG. 20A in accordance with an embodiment.

In yet another embodiment, shown in FIGS. 20A and 20B, FDTI may be incorporated in addition to the BDTI under the toroidal microlens. As shown in FIGS. 20A and 20B, FDTI 234 may have a ring-shape with a footprint that is larger than the footprint of BDTI 232. FDTI 234 may help maintain the NIR sensitivity within the inner zone of the phase detection pixel group while maintaining the asymmetric angular response in the outer zone of the phase detection pixel group.

The foregoing is merely illustrative of the principles of this invention and various modifications can be made by those skilled in the art. The foregoing embodiments may be implemented individually or in any combination.

What is claimed is:

1. An image sensor comprising a semiconductor substrate and a plurality of phase detection pixel groups, wherein each phase detection pixel group comprises:
    at least two photosensitive areas in the semiconductor substrate;
    a microlens that covers the at least two photosensitive areas;
    a color filter element that is interposed between the microlens and the at least two photosensitive areas;
    light-scattering structures formed on a first side of the semiconductor substrate, wherein each of the at least two photosensitive areas is overlapped by a respective plurality of the light-scattering structures;
    first isolation structures that are formed around a periphery of the phase detection pixel group; and
    second isolation structures that are formed between each adjacent pair of photosensitive areas within the phase detection pixel group.

2. The image sensor defined in claim 1, further comprising a reflective grid that is formed around a periphery of the color filter element of each phase detection pixel group, wherein the light-scattering structures are evenly distributed across each phase detection pixel group.

3. The image sensor defined in claim 1, wherein the light-scattering structures are unevenly distributed across each phase detection pixel group.

4. The image sensor defined in claim 1, wherein the light-scattering structures are formed in the corners of each phase detection pixel group and wherein the light-scattering structures are omitted over a central portion of each phase detection pixel group.

5. The image sensor defined in claim 1, wherein the semiconductor substrate has a second side opposite the first side and wherein each phase detection pixel group further comprises a reflective layer on the second side of the semiconductor substrate.

6. The image sensor defined in claim 1, wherein the semiconductor substrate has a second side opposite the first side, wherein each phase detection pixel group further comprises a plurality of reflectors, and wherein each photosensitive area overlaps a respective reflector of the plurality of reflectors.

7. The image sensor defined in claim 1, wherein the semiconductor substrate has a second side opposite the first side and wherein the second isolation structures comprise backside deep trench isolation structures that extend from the first side to the second side.

8. The image sensor defined in claim 1, wherein the semiconductor substrate has a second side opposite the first side and wherein the second isolation structures comprise front side deep trench isolation structures that extend partially from the second side towards the first side.

9. The image sensor defined in claim 8, wherein each phase detection pixel group further comprises:
   backside deep trench isolation structures that are formed in a ring around a central portion of the phase detection pixel group.

10. The image sensor defined in claim 9, wherein the backside deep trench isolation structures laterally surround the central portion of the phase detection pixel group, wherein a peripheral portion of the phase detection pixel group laterally surrounds the backside deep trench isolation structures, wherein the light-scattering structures overlap the peripheral portion of the phase detection pixel group, and wherein the light-scattering structures do not overlap the central portion of the phase detection pixel group.

11. The image sensor defined in claim 1, wherein the respective plurality of the light-scattering structures for each of the at least two photosensitive areas includes at least four pyramidal light-scattering structures.

12. An image sensor comprising a semiconductor substrate having first and second opposing sides and a plurality of phase detection pixel groups, wherein each phase detection pixel group comprises:
   at least two photosensitive areas in the semiconductor substrate;
   a microlens that covers the at least two photosensitive areas;
   a color filter element that is interposed between the microlens and the at least two photosensitive areas;
   deep trench isolation formed around a periphery of the phase detection pixel group; and
   light-scattering structures formed on the first side of the semiconductor substrate, wherein the number of light-scattering structures per unit area is non-uniform across the phase detection pixel group.

13. The image sensor defined in claim 12, wherein the light-scattering structures do not overlap a central portion of the phase detection pixel group.

14. The image sensor defined in claim 12, wherein each phase detection pixel group further comprises:
   isolation structures that extend in a ring around a central portion of the phase detection pixel group.

15. The image sensor defined in claim 14, wherein none of the light-scattering structures overlap the central portion of the phase detection pixel group.

16. The image sensor defined in claim 14, wherein the isolation structures comprise backside deep trench isolation structures.

17. An image sensor comprising a semiconductor substrate and a plurality of phase detection pixel groups, wherein each phase detection pixel group comprises:
   at least two photosensitive areas in the semiconductor substrate;
   a microlens that covers the at least two photosensitive areas and that has a central opening;
   a color filter element that is interposed between the microlens and the at least two photosensitive areas;
   light-scattering structures formed on a first side of the semiconductor substrate, wherein the central opening of the microlens overlaps the light-scattering structures and the light-scattering structures are not formed in a peripheral portion of the phase detection pixel group.

18. The image sensor defined in claim 17, wherein the microlens is a toroidal microlens.

19. The image sensor defined in claim 17, wherein each phase detection pixel group further comprises backside deep trench isolation structures that extend in a ring around the light-scattering structures.

20. The image sensor defined in claim 19, wherein each phase detection pixel group further comprises front side deep trench isolation structures that extend in a ring around the backside deep trench isolation structures.

* * * * *